(12) United States Patent
Chien

(10) Patent No.: US 7,442,881 B1
(45) Date of Patent: Oct. 28, 2008

(54) SHIELDING DEVICE

(75) Inventor: Ming-Feng Chien, Taipei (TW)

(73) Assignee: Ezconn Corporation, Taipei (TW)

( * ) Notice: Subject to any disclaimer, the term of this patent is extended or adjusted under 35 U.S.C. 154(b) by 0 days.

(21) Appl. No.: 11/902,534

(22) Filed: Sep. 24, 2007

(51) Int. Cl.
*H05K 9/00* (2006.01)

(52) U.S. Cl. .................... 174/382; 174/377; 174/384; 361/816

(58) Field of Classification Search ............ 174/382, 174/384, 377; 361/816, 818
See application file for complete search history.

(56) References Cited

U.S. PATENT DOCUMENTS

| | | | | |
|---|---|---|---|---|
| 5,495,399 A | * | 2/1996 | Gore et al. ............... | 361/814 |
| 5,895,884 A | * | 4/1999 | Davidson ................. | 174/372 |
| 6,377,472 B1 | * | 4/2002 | Fan ......................... | 361/800 |
| 6,552,261 B2 | * | 4/2003 | Shlahtichman et al. .... | 174/384 |
| 6,649,827 B2 | * | 11/2003 | West et al. ................ | 174/377 |
| 6,711,032 B2 | * | 3/2004 | Sommer .................... | 361/816 |
| 6,949,706 B2 | * | 9/2005 | West ........................ | 174/384 |
| D549,706 S | * | 8/2007 | Doyle et al. ............... | D14/432 |

* cited by examiner

*Primary Examiner*—Hung V Ngo
(74) *Attorney, Agent, or Firm*—Rosenberg, Klein & Lee

(57) ABSTRACT

A shielding device includes an upper cover and a lower frame. The upper cover is formed at predetermined positions with a plurality of shielding elements. When the upper cover is closed onto the lower frame, the shielding elements block clearances on the upper cover to effectively stop electric waves from entering into and leaking from the shielding device via the clearances on the upper cover.

2 Claims, 4 Drawing Sheets

SHIELDING DEVICE

FIELD OF THE INVENTION

The present invention relates to a shielding device, and more particularly to a shielding device that is able to completely stop electric waves from entering thereinto and leaking therefrom.

BACKGROUND OF THE INVENTION

FIG. 1 shows a conventional shielding device 10, which is normally mounted on a printed circuit board (PCB), on which various electronic components are arranged for electrical connection. The shielding device 10 includes an upper cover 11 and a lower frame 15. The upper cover 11 has four downward bent sidewalls 13 formed by stamping. Any two adjacent sidewalls 13 are not connected with each other but to leave a clearance 14 between them. The lower frame 15 is integrally formed and bent by stamping, and a small opening 17 is formed at an upper end of each joint 16 of two adjacent sides of the lower frame 15. When the upper cover 11 is closed onto the lower frame 15, a through hole would exist at each top corner of the upper cover 11 as a result of the clearance 14 and the small opening 17 formed thereat, as indicated by the arrow 18. Electric waves could enter into or leak from the shielding device via these through holes to interfere with communication and endanger human body health. Therefore, it is necessary to improve the conventional shielding device.

SUMMARY OF THE INVENTION

A primary object of the present invention is to provide a shielding device that effectively stops electric waves from entering thereinto and leaking therefrom.

To achieve the above and other objects, the shielding device according to the present invention includes an upper cover and a lower frame. The upper cover is formed at predetermined positions with a plurality of shielding elements. When the upper cover is closed onto the lower frame, the shielding elements block clearances on the upper cover to effectively stop electric waves from entering into and leaking from the shielding device via the clearances on the upper cover.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
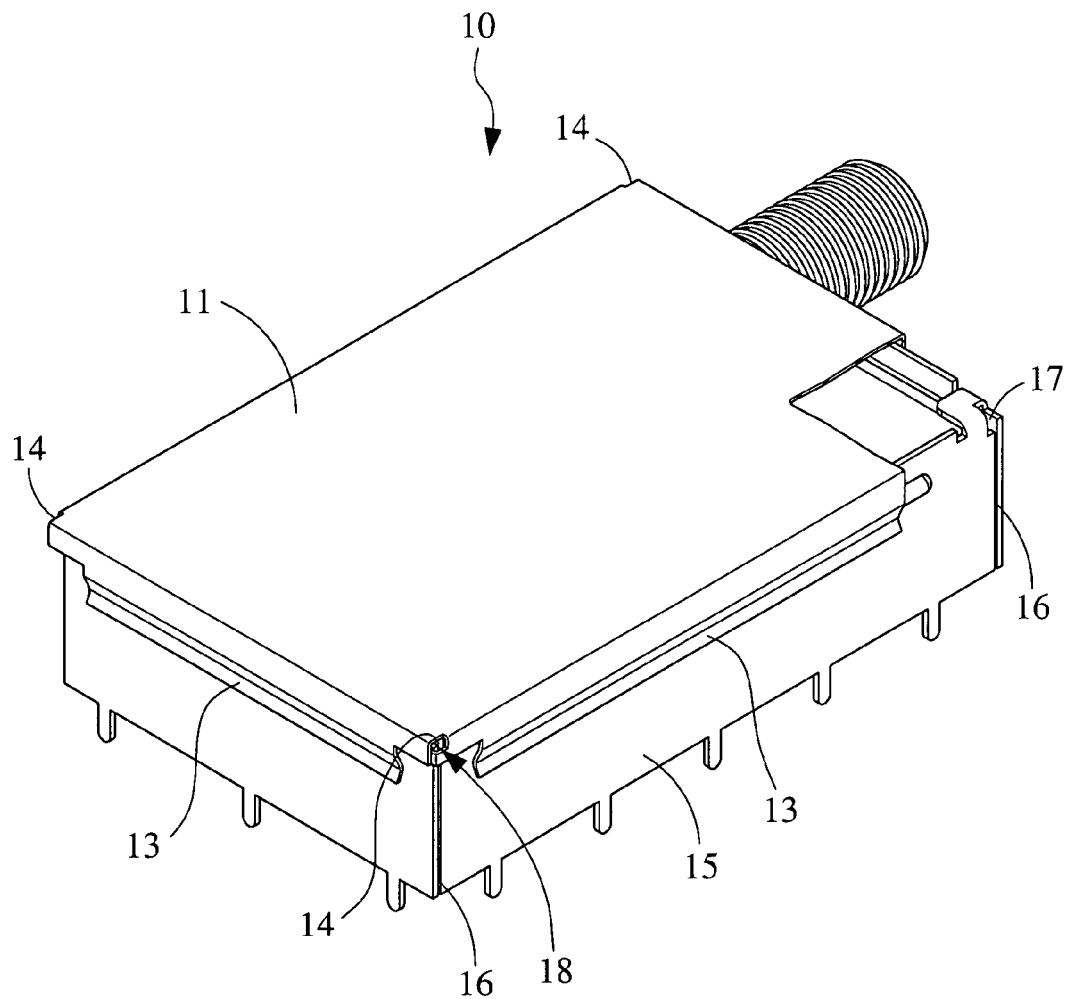
FIG. 1 is a perspective view of a conventional shielding device.
Figure 2:
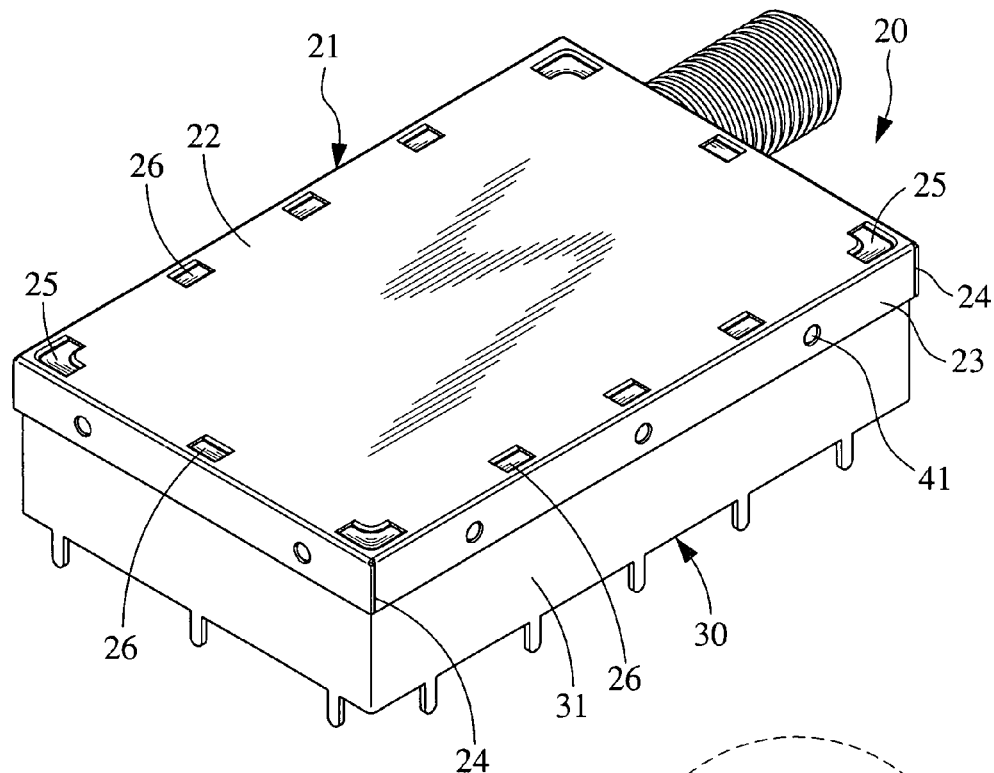
FIG. 2 is an assembled perspective view of a shielding device according to the present invention.
Figure 5:
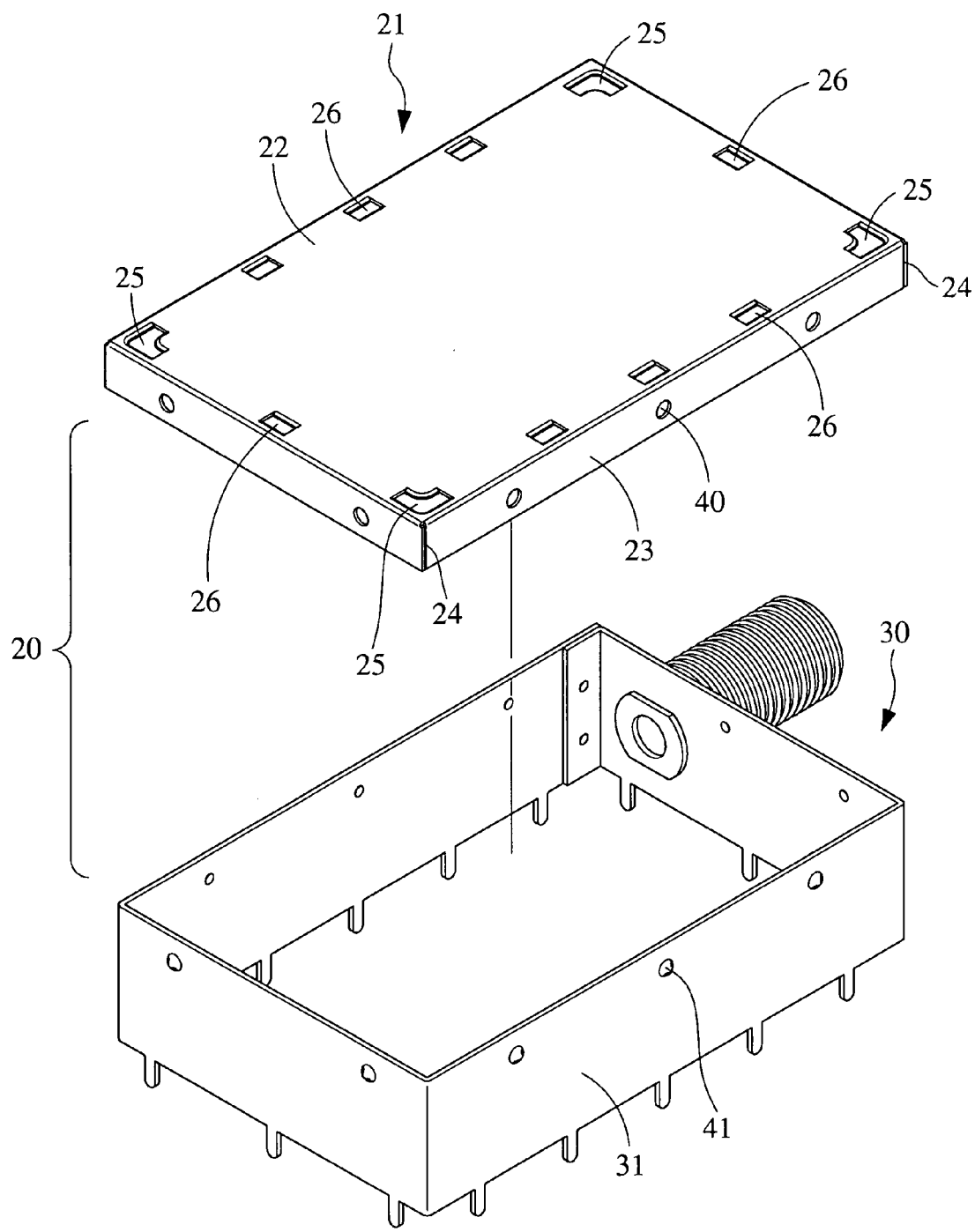
FIG. 5 is an exploded perspective view of the shielding device of the present invention.

Please refer to FIGS. 2 and 5 that are assembled and exploded perspective views, respectively, of a shielding device 20 according to the present invention. As shown, the shielding device 20 includes an upper cover 21 and a lower frame 30. The lower frame 30 is fixed to a printed circuit board (not shown) by way of soldering.

Figure 6:
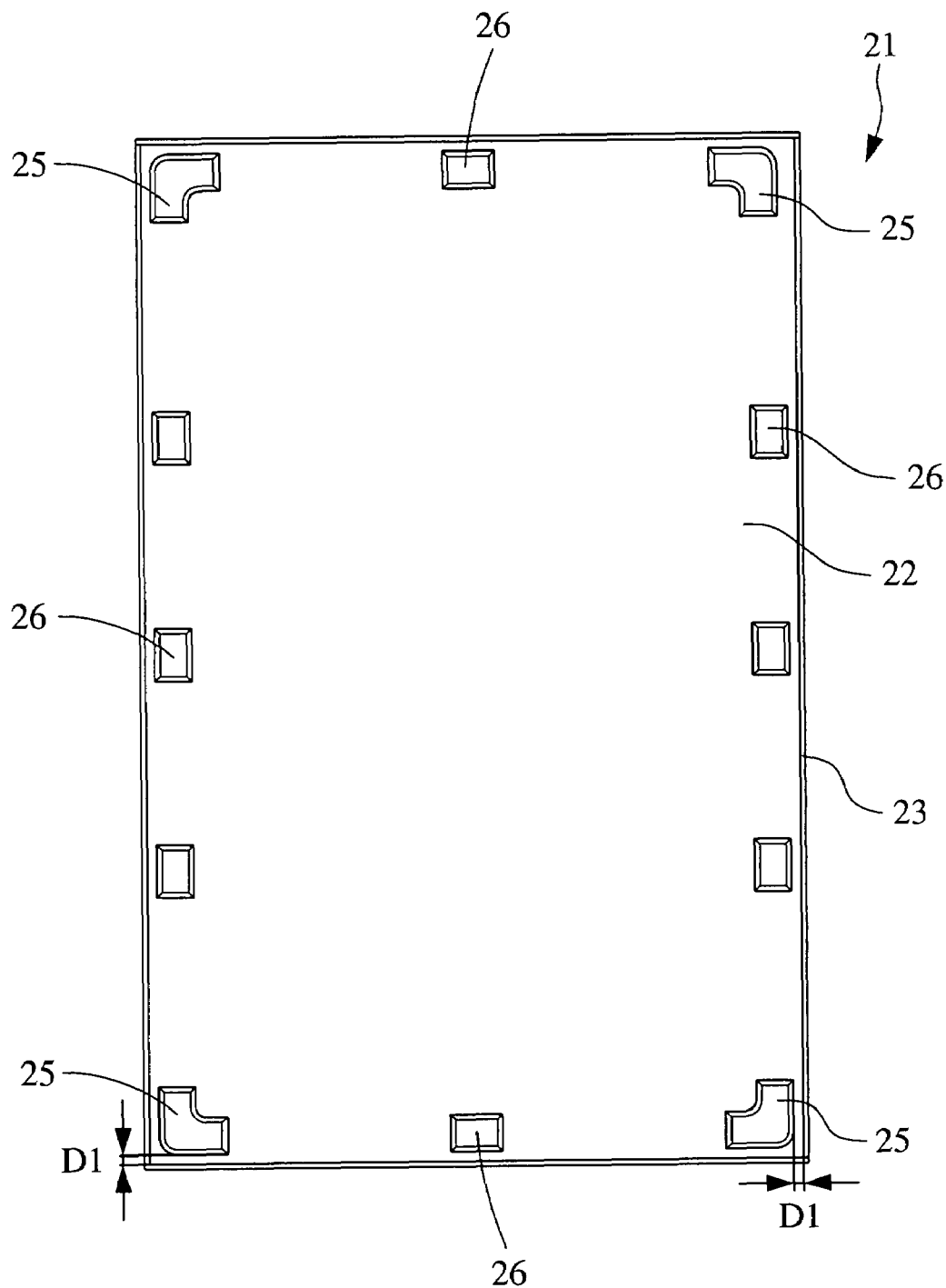
FIG. 6 is a bottom view of an upper cover of the shielding device of the present invention.

The upper cover 21 is an integrally stamped member including a rectangular main body 22 and four downward bent sidewalls 23, such that a clearance 24 is left between any two adjacent sidewalls 23. The main body 22 is also stamped to form a shielding element 25 close to each of four corners of the main body 22. As can be seen from FIGS. 3 and 4, each of the shielding elements 25 is a sunken area on the main body 22, so that a space D1 is formed between the shielding element 25 and each sidewall 23 of the main body 22, as shown in FIG. 6. Moreover, the main body 22 is stamped to form one or more recesses 26 along each edge of the main body 22, such that the recesses 26 are equally spaced between any two adjacent shielding elements 25.

Figure 4:
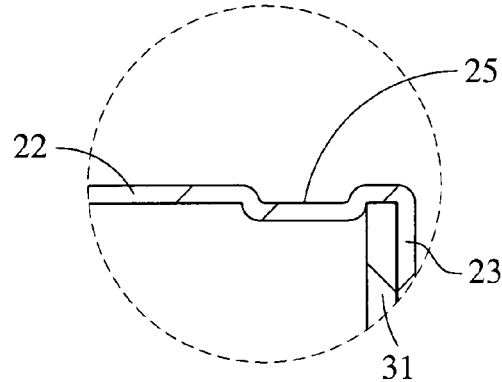
FIG. 4 is an enlarged view of the area encircled by broken line 4 in FIG. 3.
Figure 3:
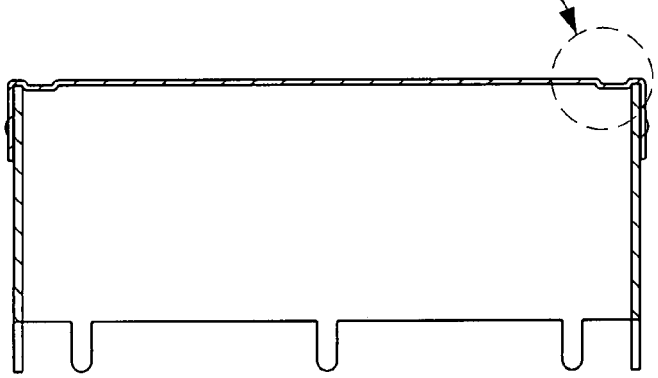
FIG. 3 is a cross sectional view of the shielding device of the present invention.

The lower frame 30 is a rectangular frame having four continuous connecting walls 31 formed by bending an integral strip of sheet material. The connecting walls 31 have a thickness substantially equal to the space D1. Therefore, when the upper cover 21 is closed onto the lower frame 30, upper edges of the connecting walls 31 are separately located in the spaces D1 between the sidewalls 23 and the shielding elements 25, as shown in FIGS. 3 and 4. In this manner, the clearances 24 left between any two adjacent sidewalls 23 of the upper cover 21 are blocked by the shielding elements 25.

The shielding device 20 further includes fastening means including a plurality of through holes 40 spaced on the sidewalls 23 of the upper cover 21 and a plurality of protrusions 41 spaced on outer sides of the connecting walls 31 of the lower frame 30 corresponding to the through holes 40. When the upper cover 21 is closed onto the lower frame 30, the protrusions 41 are forced into the through holes 40, enabling the upper cover 21 to tightly connect to the lower frame 30.

When the upper cover 21 is tightly connected to the lower frame 30, the clearances 24 between the adjacent sidewalls 23 of the upper cover 21 are blocked by the shielding elements 25 to effectively stop electric waves from entering into or leaking from the shielding device 20.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A shielding device, comprising an upper cover and a lower frame fixed to a printed circuit board; the upper cover including a rectangular main body and four downward bent sidewalls integrally extended from four edges of the main body with a clearance left between any two adjacent ones of the sidewalls; and the lower frame being a rectangular frame having four continuous connecting walls formed by bending an integral strip of sheet material; and the main body of the upper cover being formed near each of four corners with a shielding element, such that a space is formed between each shielding element and the sidewall adjacent thereto;

whereby when the upper cover is closed onto the lower frame, upper edges of the connecting walls of the lower frame are located in the spaces formed between the shielding elements and the sidewalls of the upper cover, and the clearances on the upper cover are effectively blocked by the shielding elements to prevent electric waves from entering into and leaking from the shielding device.

2. The shielding device as claimed in claim 1, wherein the main body of the upper cover includes one or more recesses equally spaced along each of the four edges between two adjacent shielding elements.

* * * * *

UNITED STATES PATENT AND TRADEMARK OFFICE
Certificate

Patent No. 7,442,881 B1                                                                                  Patented: October 28, 2008

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Ming-Feng Chien, Taipei (TW); and Wei-Chun Tsao, Taipei City (TW).
  M Signed and Sealed this Twenty-First Day of August 2012.

MINH-TOAN TON
*Supervisory Patent Examiner*
Art Unit 2882
Technology Center 2800